United States Patent
Salzer et al.

(10) Patent No.: US 6,520,399 B1
(45) Date of Patent: Feb. 18, 2003

(54) THERMOSONIC BONDING APPARATUS, TOOL, AND METHOD

(75) Inventors: Thomas E. Salzer, Bedford, MA (US); Aaron C. DerMarderosian, Lexington, MA (US); Vincent C. Caccamesi, Wilmington, MA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/952,829

(22) Filed: Sep. 14, 2001

(51) Int. Cl.[7] ............ B23K 1/06; B23K 37/00; B23K 3/047
(52) U.S. Cl. ............ 228/110.1; 228/1.1; 219/56.21; 219/56.22; 219/85.16
(58) Field of Search .............. 228/1.1, 110.1, 228/4.5, 180.5; 219/56.21, 56.22, 85.16

(56) References Cited

U.S. PATENT DOCUMENTS

| | | | | |
|---|---|---|---|---|
| 4,171,477 A | * | 10/1979 | Funari | 219/113 |
| 4,315,128 A | | 2/1982 | Matcovich et al. | |
| 4,605,833 A | * | 8/1986 | Lindberg | 219/56.21 |
| 4,821,944 A | * | 4/1989 | Tsumura | 219/56.21 |
| 4,845,354 A | * | 7/1989 | Gupta et al. | 219/121.62 |
| 4,893,742 A | * | 1/1990 | Bullock | 219/121.63 |
| 4,970,365 A | * | 11/1990 | Chalco | 219/121.63 |
| 5,002,217 A | * | 3/1991 | Tani et al. | 219/56.21 |
| 5,110,032 A | * | 5/1992 | Akiyama et al. | 219/497 |
| 5,138,127 A | * | 8/1992 | Fries et al. | 219/109 |
| 5,142,117 A | * | 8/1992 | Hoggatt et al. | 156/73.1 |
| 5,240,166 A | * | 8/1993 | Fontana et al. | 219/85.16 |
| 5,298,715 A | * | 3/1994 | Chalco et al. | 219/121.64 |
| RE35,180 E | * | 3/1996 | Paufve et al. | 219/85.16 |
| 5,894,983 A | | 4/1999 | Beck et al. | |
| 5,948,286 A | * | 9/1999 | Chalco et al. | 219/121.63 |
| 6,180,891 B1 | * | 1/2001 | Murdeshwar | 174/260 |
| 6,337,453 B1 | * | 1/2002 | Miller et al. | 219/56.21 |

* cited by examiner

Primary Examiner—Tom Dunn
Assistant Examiner—Kiley Stoner
(74) Attorney, Agent, or Firm—Iandiorio & Teska

(57) ABSTRACT

A thermosonic bonding apparatus including an ultrasonic transducer; a bonding tool including a high resistivity tip, and a low resistivity shaft extending from the tip; a tool support arm interconnecting the bonding tool and the ultrasonic transducer to vibrate the high resistivity bonding tool tip; and a voltage source connected to the bonding tool to locally heat the high resistivity bonding tool tip in a pulsed fashion.

18 Claims, 5 Drawing Sheets

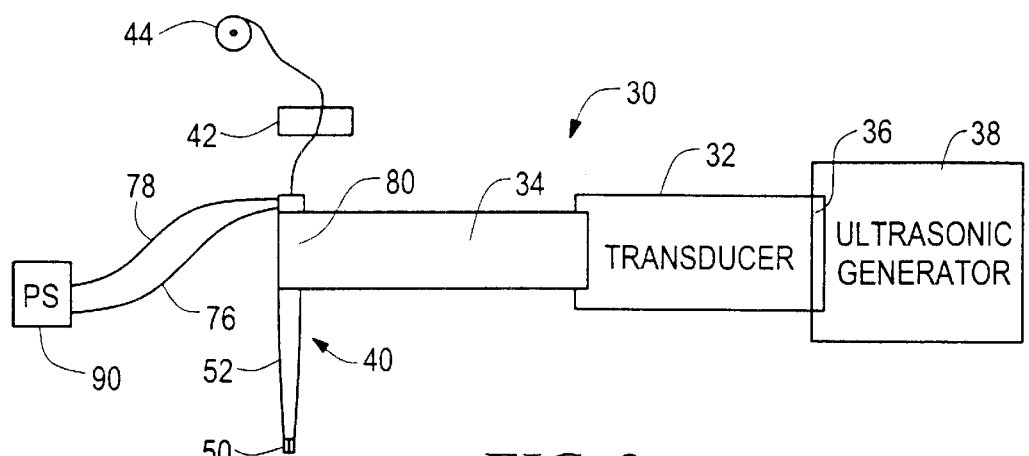
*FIG. 3*
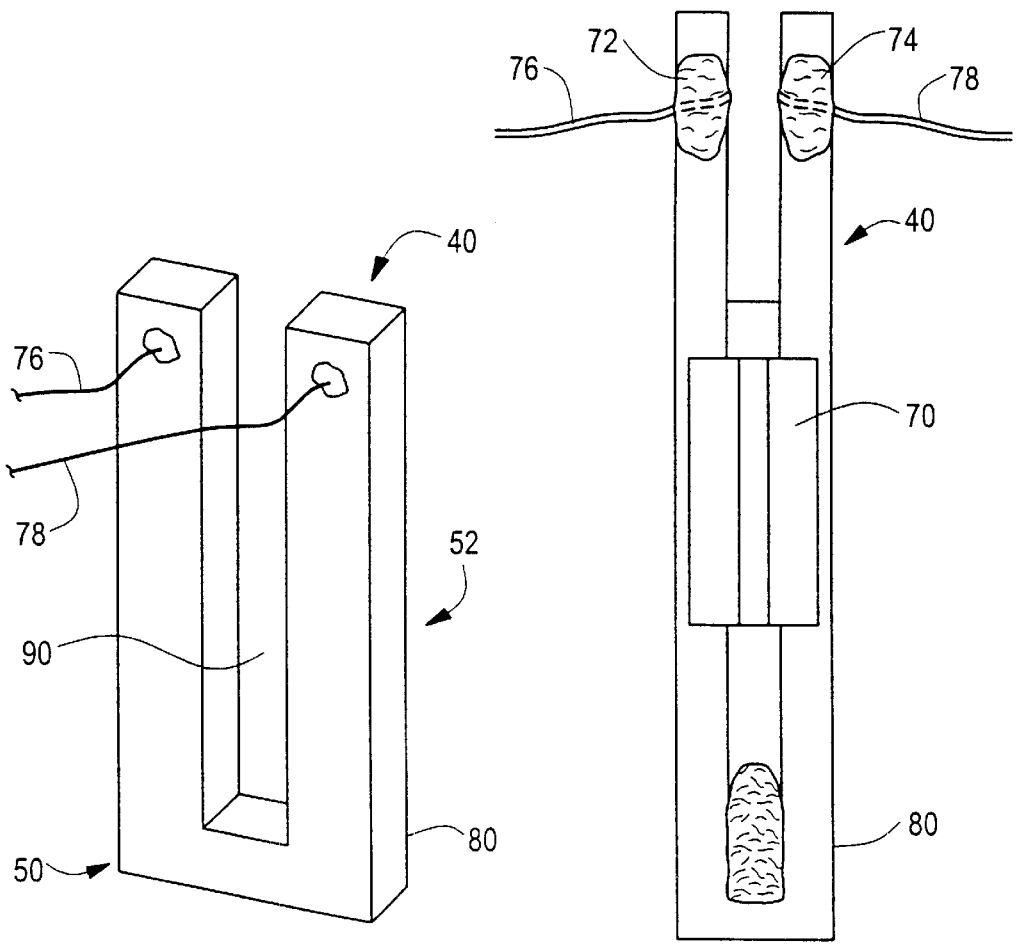
*FIG. 4*   *FIG. 5*

THERMOSONIC BONDING APPARATUS, TOOL, AND METHOD

FIELD OF THE INVENTION

This invention relates to an ultrasonic bonding tool apparatus and method of bonding a conductor to different conductive bonding sites useful, for example, to bond gold wires or ribbons to different bonding sites.

BACKGROUND OF THE INVENTION

Conductive gold wires and ribbons are often used to electrically connect the bond pads of an electronic component to the interconnect leads of a support package or substrate.

It is known in the art to use both high temperatures and/or ultrasonic energy in automated wiring equipment to bond the gold conductors to various bond sites.

Some electronic components, however, cannot withstand the high temperatures associated with prior art bonding techniques. In addition, cooling systems must be employed with the ultrasonic wiring equipment to prevent damage thereto and/or to prevent variations in the ultrasonic energy delivered to the bonding tool.

Gold can be bonded at room temperature using ultrasonic energy provided, however, that the gold conductor is very clean. Gold can be cleaned by methods such as plasma cleaning and then reliably bonded at much lower temperatures than gold surfaces which have been exposed to airborne contaminants for even a few minutes. Plasma cleaning gold wire and ribbon, however, results in an additional cost to the finished assembly and, because the bondability of clean gold surfaces degrades rapidly on exposure to air, conventional bonding techniques require that the bonds be made within a short time after cleaning. If the specified time period lapses before bonding is completed, the material must be re-cleaned.

In U.S. Pat. No. 5,894,983 incorporated herein by this reference, a support structure is heated to only 25–85° C. using a convection heat source and the ultrasonic bonding tool is vibrated at a higher frequency, (e.g., 122 KHz–140 KHz).

This patent exemplifies the tradeoff between temperature and bond strength. In general, unless the gold is very clean, a good ultrasonic bond at low temperatures is difficult to reliably obtain. Bonding engineers are well aware that gold to gold bonding is not difficult as long as there is no temperature restriction imposed on the process. In the semiconductor industry, bonding is routinely performed at 300° C. or higher. Larger and more complex assemblies, however, are usually fabricated from materials that degrade at elevated temperatures. Thus, for many projects, the bonding engineer is requested to select a room temperature process. The only known room temperature process available is ultrasonic bonding. Gold, however, is difficult to ultrasonically bond at room temperature unless, as stated above, it is very clean. Thus, under normal conditions, gold must be ultrasonically bonded at elevated temperatures. The temperatures selected by the bonding engineer is generally as high as the process specifications will permit. Higher temperatures yield stronger bonds and smaller bond strength deviation.

Thermosonic bonding is a combination of thermocompression and ultrasonic bonding in which heat is intentionally added to the vibrating bond tool in a steady state manner. In addition, heat is often added to the substrate. Heating of the tool or substrate, however, can create problems if the materials being bonded are subject to thermal degradation. Modem thermosonic bonding usually employ a heated tool and a substrate temperature of only 125° C. or less. Thus, there is always a trade off between bond temperature, bond strength, and reliability.

SUMMARY OF THE INVENTION

It is therefore an object of this invention to provide a thermosonic bonding apparatus, a bonding tool, and a method which achieves higher reliability bonds.

It is a further object of this invention to eliminate the need for and the expense associated with an intensive gold cleaning processes.

It is a further object of this invention to eliminate the need for heat sources.

It is a further object of this invention to prevent thermal damage to electronic components during the bonding process.

It is a further object of this invention to provide a thermosonic bonding tool which has a very long useful life.

This invention results from the realization that by locally heating only the tip of a bonding tool with a short thermal impulse synchronized with the delivery of ultrasonic energy to the bonding tool, the need for ultra clean gold and the need for heat sources is eliminated without causing thermal damage to the electronic components and yet, at the same time, a better bond is made because both heat and ultrasonic energy are used.

This invention features a thermosonic bonding apparatus comprising an ultrasonic transducer; a bonding tool including a high resistivity tip and a low resistivity shaft extending from the tip; a tool support arm interconnecting the bonding tool and the ultrasonic transducer to vibrate the high resistivity bonding tool tip; and a voltage source connected to the bonding tool to heat the high resistivity bonding tool tip.

In one example, the bonding tool includes an insulative gap in the shaft to direct current to the high resistivity tip. Typically, the voltage source is connected to the bonding tool by a pair of conductors each contacting the shaft on opposite sides of the insulative gap. Preferably, the conductors contact the shaft at a nodal location.

In the prototype example, the bonding tool was made of a ceramic alloy composition and the high resistivity tip was wedge shaped.

A thermosonic bonding tool apparatus in accordance with this invention includes a bonding tool including with a high resistivity tip, and a low resistivity shaft extending from the tip; means for imparting vibrations to the high resistivity tip; and means for locally heating the high resistivity tip. The means for imparting vibration typically includes an ultrasonic transducer and a tool support arm interconnecting the bonding tool and the ultrasonic transducer to vibrate the high resistivity bonding tool tip. The means for locally heating may include a voltage source connected to the bonding tool to provide pulses of voltage to the bonding tool to heat the tip of the bonding tool in a pulsed fashion. Alternatively, other heating sources may be used such as a laser. The bonding tool may include an insulative gap in the shaft to direct current to the high resistivity tip and the voltage source is connected to the bonding tool by a pair of conductors each contacting the shaft on opposite sides of the insulative gap. Preferably, the conductors contact the shaft at a nodal location. The entire bonding tool may be made of a ceramic alloy composition or, alternatively, just the tip is made of a ceramic alloy and the shaft is then made of a different low resistivity material.

The method of bonding a conductor to conductive bonding sites in accordance with this invention includes the steps of a) bringing the conductor into contact with a first bonding site via the tip of a bonding tool; b) applying a thermal pulse to the tip of the bonding tool; c) vibrating the tip of the bonding tool while it is heated to thermosonically bond the conductor to the first bonding site; d) terminating the thermal pulse and the vibrations; e) bringing the conductor into contact with a second bonding site via the tip of the bonding tool; and f) repeating steps b) and c). The application of the thermal pulse may be automatically synchronized with the application of the ultrasonic energy.

The tip of the tool can be heated to between 50° C. and 1,000° C. and vibrated at between 40 KHz–80 KHz. Typically, the bonding tool used is configured as described above but this is not a necessary limitation of the subject invention.

In one embodiment, the bonding tool includes a high resistivity ceramic tip, and a low resistivity shaft extending from the ceramic tip. An ultrasonic transducer is employed to vibrate the high resistivity ceramic tip which is also locally heated in a pulsed mode by a source such as a voltage source.

BRIEF DESCRIPTION OF THE DRAWINGS

Other objects, features and advantages will occur to those skilled in the art from the following description of a preferred embodiment and the accompanying drawings, in which:

FIG. 3 is a schematic view of a thermosonic bonding apparatus in accordance with the subject invention;

FIG. 4 is a three-dimensional schematic view showing the unique bonding tool of the subject invention;

FIG. 5 is a photograph of a prototype bonding tool made in accordance with the subject invention;

DISCLOSURE OF THE PREFERRED EMBODIMENT

Figure 1:
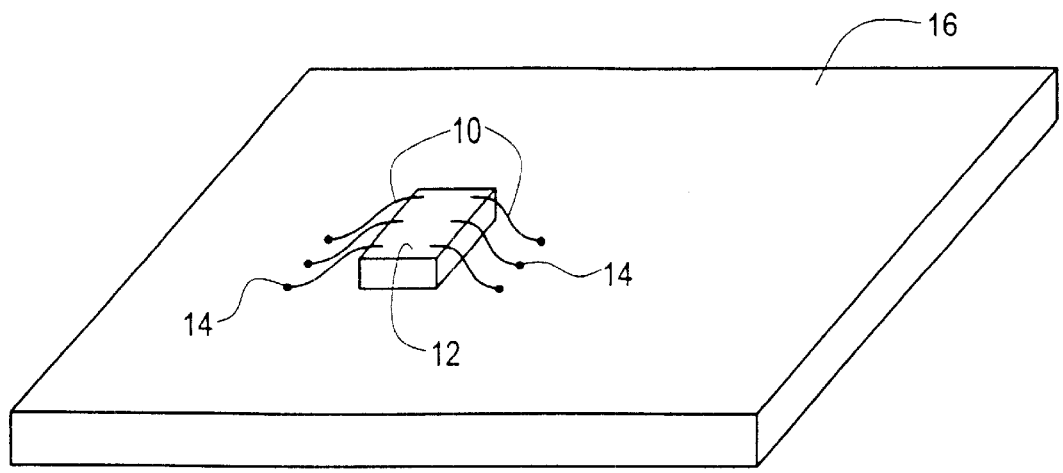
FIG. 1 is a schematic view showing an electronic component electrically interconnected to a circuit board using gold wire or ribbon in accordance with the subject invention.
Figure 2:
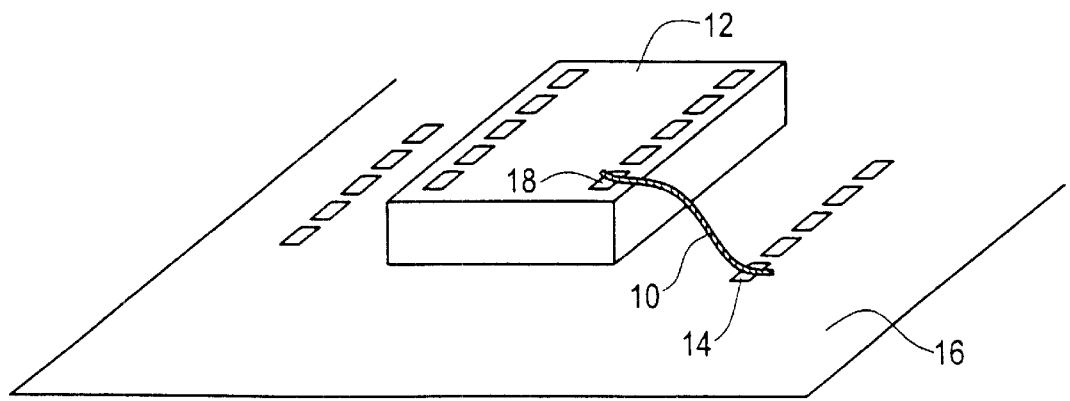
FIG. 2 is another schematic view similar to FIG. 1 showing in more detail a single gold ribbon electrical interconnect.

In one non-limiting example, gold wires or ribbons 10, FIG. 1 electrically interconnect electronic component 12 to bond sites 14 on circuit board 16. As shown in FIG. 2, gold ribbon 10 electrically interconnects bond pad 18 of component 12 with bond site 14 on circuit board 16.

In the prior art, ultrasonic energy and/or heat energy was used to bond each end of gold ribbon 10 to bond sites 18 and 14 using conventional wiring equipment as discussed in U.S. Pat. No. 5,894,983 incorporated herein by this reference. Still, the bonds were, in some examples, reinforced with an epoxy.

Currently available gold bonding processes, however, require very clean materials with specific temperature requirements in order to yield only marginal results. The cleanliness requirements are such that the atomically clean surface becomes contaminated within minutes, even in clean room environments, to the point where reliability is reduced. Others have tried to solve this problem by raising the ambient bonding temperature. This approach works from a bonding stand point, however, the performance of many electronic assemblies is degraded when subject to elevated bonding temperatures. Others have experimented with trying to optimize the frequency of vibration of ultrasonic energy in order to permit bonding at reduced ambient temperatures. Still other have heated the bonding tool in an attempt to reduce the ambient bonding temperatures.

In this invention, elevated bond temperatures are desirable for creating a replicable bond. Although presently configured processes attempt to circumvent the elevated temperature requirement by a variety of methods, none of these methods have proven to be entirely satisfactory. The subject invention addresses and solves the prior art problems by producing a very fast and localized thermal impulse which is synchronized with the application of acoustic energy. The unique design of the bonding tool of this invention allows the peak temperature of the thermal impulse to be continuously adjusted from slightly above ambient to well over the melting temperature of gold. Because the tool is only heated while the bond is actually being made, the average tool temperature is maintained at ambient temperature while the peak temperature may be adjusted to any desirable level. The thermal impulses are sufficiently rapid and localized such that no damage occurs to adjacent devices or structures. Furthermore, the design of the tool permits efficient transmission of acoustic energy from the ultrasonic transducer to the bond while the tool is being heated by the thermal impulse.

Ultrasonic bonding apparatus 30, FIG. 3 includes ultrasonic transducer 32 fixed to tool support arm 34, energizing electrode 36, and ultrasonic generator 38. Bonding tool 40, FIGS. 3–5 is affixed to the distal end of arm 34. The operation of ultrasonic transducer 32, energizing electrode 36, tool support arm 34, and ultrasonic generator 38 and the use of a three dimensional translation system is disclosed in U.S. Pat. No. 5,894,983 as is the operation of clamp 42 and gold ribbon spool 44. In that patent, however, the bonding tool was a commercially available titanium carbide wedge configured tool.

In this invention, in contrast, bonding tool 40 includes high resistivity tip 50 and low resistivity shaft 52 extending therefrom. In one example, bonding tool 40 is made of a ceramic alloy comprised mainly of silicon carbide, aluminum nitride and molybdenum disulfide. Low resistivity shaft is effected by material selection, material treatment, and/or the shape of shaft 52.

In the prototype example, this hard ceramic device was configured originally as a resistance heater/igniter which can obtain tip temperatures of greater than 1,000° C. continuously in air with no degradation. The prototype example was originally designed to be used as an ignition device for gas stoves and furnaces. Support 70, FIG. 5, was added and designed to adapt the igniter to ultrasonic arm 34, FIG. 3. Moreover, the ceramic was metalized as shown in 72 and 74 in FIG. 5 to facilitate attachment of wires 76 and 78 to conduct current through the tool. Also, a 45° wedge was machined in the tip of the tool as shown at 80. Insulative gap 90 was inherent in the igniter and served to direct current to high resistivity tip 50. Wires 76 and 78 are attached on opposite sides of insulative gap 90 as shown in FIG. 4.

In the bonding industry, it is common practice to model a vibrating bonding tool as a transversely resonant free—free beam driven at an antinode. Because tool 40 is fairly thin compared to a standard tool, it was decided to model it as two fixed-free cantilevers, one above and one below the horn. The length of tool extension below clamping location 80, FIG. 3 was designed to be resonant at the 60 KHz of transducer 32, FIG. 3. The extension of the tool extending above the transducer was also designed to be resonant with one nodal location where lead wires 76 and 78 are attached. This location is selected because it has minimum effect on the tool vibration and tends not to cause fatigue of the lead wires. Multi-strand, fatigue resistant wires are preferred.

Voltage source 90, FIG. 3 is connected to bonding tool 40 via wires 76 and 78 to, in one embodiment, locally heat high resistivity tool tip 50.

In another embodiment, to avoid the need for a custom power supply to heat tool 40, a conventional pulse generator can be triggered by the ultrasonic power supply. The output of the pulse generator drives a power supply that is capable of being used as a power amplifier. The output of the power supply is essentially a constant voltage pulse. The thermal time constant of the heating element was measured to be about two seconds. Since two seconds is much longer than the time normally required to make a bond, equilibrium temperature in the normal bonding time range of 50–100 ms may not be obtained. This presents no problem, however, if the tool is driven with a voltage approximated width to reach the desired temperature in the bond time period. Extending the pulse width will result in a higher temperature. At higher repetition rates, the tool 42 may not cool all the way down to room temperature between the bonds. If the tool is pulsed before it returns to room temperature, it may reach a higher temperature than it did during the previous pulse. The ceramic tool material, however, has a very high positive coefficient of resistance with temperature. This property can be used to provide electronic temperature control in a mass produced thermosonic bonding apparatus. In the prototype design, about 18 watt seconds (joules) is required to heat the tool to 300° C. for each bond. A portion of that energy may be conducted up the tool shaft and into transducer 32, FIG. 3. At low bonding rates, however, sufficient time can be allowed between bonds so that transducer 32 is not heated. At higher repetition rates, some cooling may be required such as forced convection or liquid cooling apparatus. For the purposes of conducting the preliminary tests discussed below, the repetition rate of the machine was made sufficiently low that the tool returned to room temperature between bonds. Bonding tool 40, FIGS. 4–5 was configured wider than the conventional 0.125 inch diameter hole in the arm 34, FIG. 3. To accommodate the extra width, a release slot was machined into the standard ultrasonic horn arm. In one example, a new horn 34 was designed, fabricated, and tuned to match the system such that it has a more robust diameter at the tool end and functioned better or equivalent than the original. The new horn had an amplitude gain of about only 50 percent of the original "Orthodyne" horn but since the bonding method hereof uses only a fraction of the potential output of the transducer, the lower horn gain only required a slight increase in acoustic power.

Pulsed thermosonic bonding tool 40, FIGS. 3–5 can be machined to any desired shape by a variety of methods. Thus, it can be tailored to meet a multitude of bonding applications from micro sizes in the 0.001 inch regime, to very large wires and ribbons. Although the tool used for the tests disclosed herein has a 0.050 inch wide dielectric slot 90, FIGS. 4–5 which limits its usefulness in very tight spaces, it was conveniently fabricated from a standard igniter. Different slot widths can be achieved if one were to start with unmachined ceramic material. The ceramic material used is very inert and does not appear to react with aluminum, gold, or any of the commonly bonded materials. The tungsten carbide material that is commonly used for bonding tools, in contrast, adversely reacts with gold which diffuses into the nickel binder and eventually causes erosion of the tool tip. The ceramic tool of the subject invention does not react with oxygen or nitrogen and, as such, can be operated in air and at a temperature in excess of 1,000° C. with no degradation.

In some prior art cases, the bonding tools intended for use with gold are designed with a cross groove. The theory is that this groove assists in maintaining close coupling between the vibrating tool and the gold wire or ribbon. During testing of tool 40, FIGS. 4-5, it was noted, however, that good coupling was consistently achieved without the need for a cross groove because the ceramic tool material exhibits a surface property that helps to maintain good coupling to the materials being bonded. The new tool material also functioned very well for bonding aluminum wire and ribbon.

Figure 6:
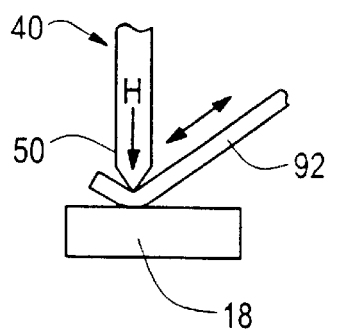
FIGS. 6–8 are schematic views showing the primary steps associated with the thermosonic bonding method of the subject invention.
Figure 7:
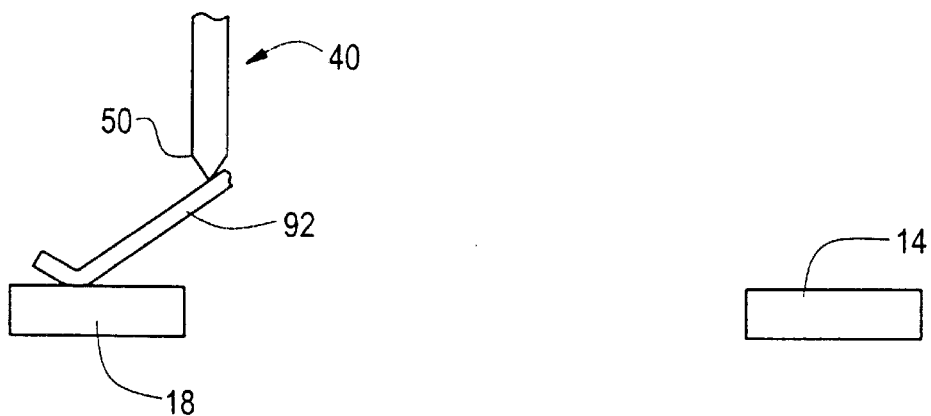
Figure 8:
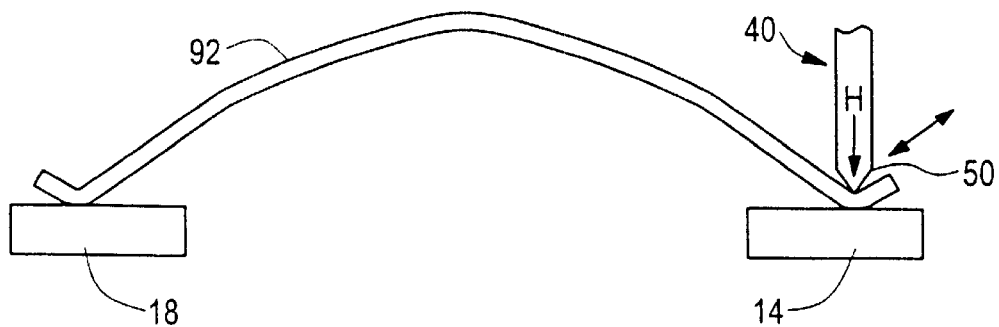

As shown in FIGS. 6–8, the method of bonding a conductor 92 to conductive bonding sites 18 and 14, FIG. 6 includes bringing the conductor 92 into contact with first bonding site 18 via the tip of bonding tool 40. A thermal pulse is then applied to bonding tool 40 to locally heat tip 40 of bonding tool 40 which is also vibrated while it is heated to thermosonically bond conductor 92 to first bonding site 18. The thermal pulse then ends and the vibrating motions stopped as shown in FIG. 7 until conductor 92 is brought into contact with second bonding site 14 as shown in FIG. 8 via the tip of bonding tool 40 whereupon a thermal pulse is again applied to tip 50 of bonding tool 40 simultaneously with vibrating tip 50. Typically, the tip of the tool can be heated anywhere between 50 and 1,000° C. and vibrated at a frequency of between 40 KHz to 80 KHz. In a manufacturing environment, the application of the thermal pulses would be automatically synchronized with the application of the ultrasonic energy.

Figure 9:
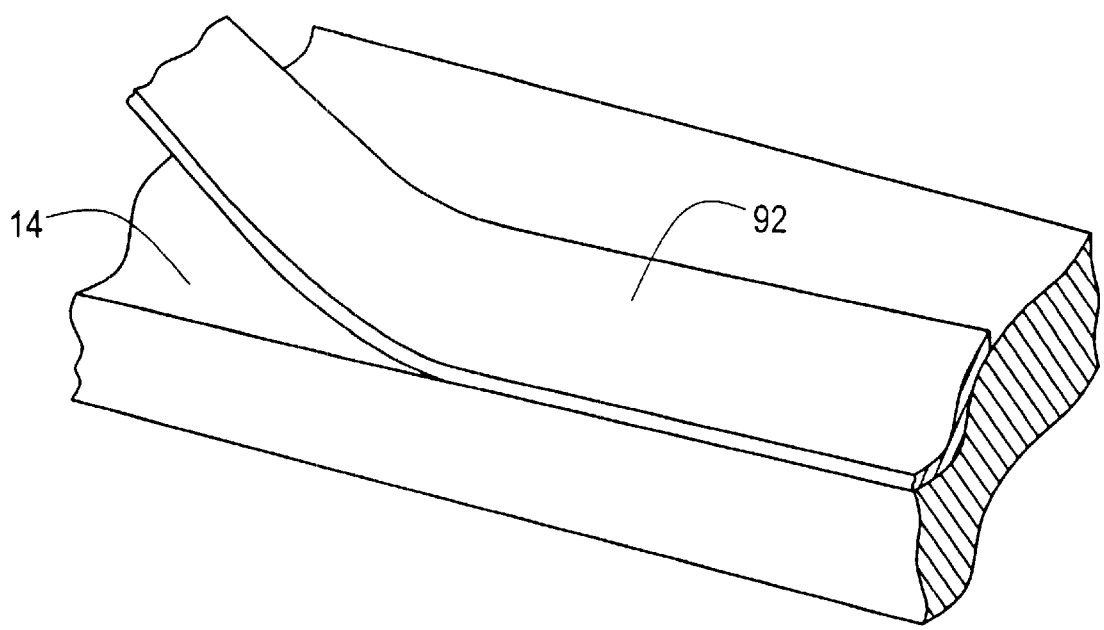
FIG. 9 is photograph showing a bond made in accordance with the method of the subject invention.

FIG. 9 shows gold ribbon 92 bonded to gold bond site 14. In order to effect thermal calibration, a peak tool temperature of about 300° C. was determined using a small piece of gold eutectic 300° solder placed under the tool and the apparatus cycled as discussed above. The voltage to the tool was increased until the solder just melted. In a mass produced device, thermocouples may be used to provide a closed loop thermal calibration system. During pull testing, the failure mode was almost exclusively a fracture of the gold ribbon of some type as compared to ultrasonically bonded ribbons in which the failure mode was always a cohesive failure at the gold-gold interface.

In this invention, the bonded metals were so strong that the failure occurred sometimes as a ribbon tensile failure remote from the bond area. This is almost an unheard of failure mode for this type of testing and likely indicates that acoustic hardening of the gold ribbon predominates over any annealing effect that may have occurred during the brief thermal pulse. Moreover, these test results indicate that thermal pulses are at least as effective as steady state heating for the purpose of producing strong, reliable bonds without the need to clean the gold wire or ribbon material. Unlike steady state heating, however, the thermal pulses used in accordance with the subject invention have the advantage of not causing degradation of the components or the substrate.

The method of this invention also minimizes or eliminates stringent cleaning requirements, and eliminates degradation of the gold ribbon or wire properties caused by steady state heating and continuously heated tools. Moreover, epoxy was not required to reinforce the bonds.

Figure 10:
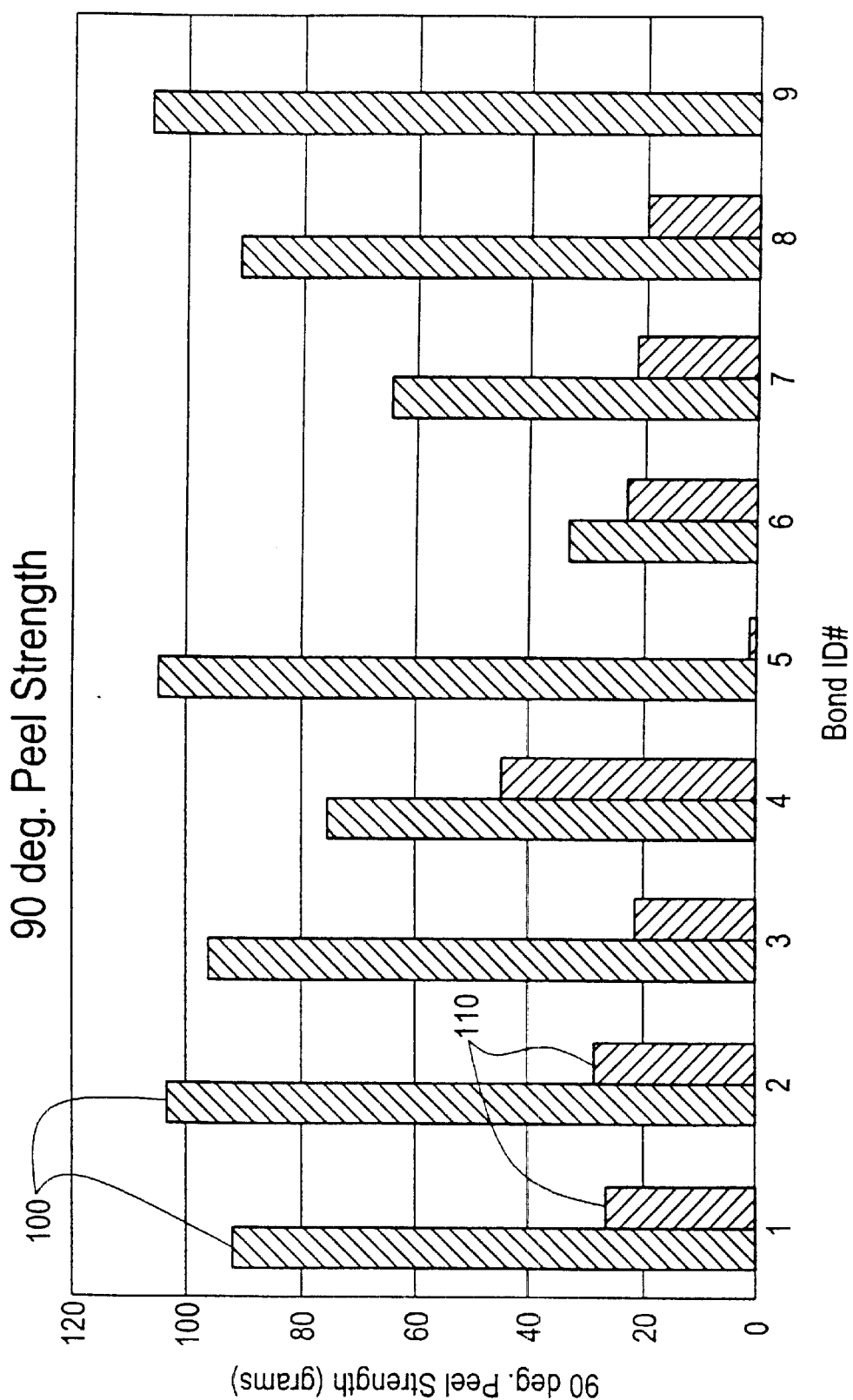
FIG. 10 is a graph showing the increased peel strength for a number of test samples bonded in accordance with the method and apparatus of the subject invention.

Although the initial bonds with gold ribbon look very promising, a test methodology was needed in order to evaluate the effectiveness of the process. The method eventually selected involved determining bond parameters that yielded adequate bonds without thermal assists. The strength of these bonds were compared to bonds made with exactly the same parameters, but with the pulsed thermal assist activated. In practice, this involves switching electrical pulsing power supply 90, FIG. 3 off during every other bond. By alternating from thermally assisted bonds to thermally unassisted bonds, any drift in performance parameters such as tool wear, changes in acoustic performance, and the like could be factored out. In the prototype example, each wire was only about one inch long with a bond near one end. At the Instron tensile tester, wires were carefully bent at 90° to the substrate. They were then clamped in a small clamp designed for this purpose and pulled at one millimeter per minute to destruction. This 90° peel test produced the highest localized stress of any destructive test method, far higher than the hook pull test which produces a combination of sheer and peel stresses. The gold ribbon used for this testing was 0.001×0.010 inch gold supplied by Williams Precious Metals. The substrate consisted of 0.50 ounce gold plated copper on 0.062 inch thick Polyimid. Both the ribbon and substrates were used in the as received condition and no cleaning was employed for either. As shown in FIG. 10, tool 40, FIGS. 3–5 operated in the pulsed thermal mode as shown at 100 resulted in a much greater 90° peel strength than when operated without any thermal energy as shown at 110 for each of nine test sample pairs.

The significant increase in bond strength coupled with the shift and failure mode from adhesive to cohesive provides compelling evidence to support the theory that short acoustic pulses properly phased with thermal pulses can provide dramatic increases in bond strength. Thus, this new process capability should result in a significant increase in wire and ribbon bond interconnection reliability. Those skilled in the art will understand how to tailor the prototype design shown in FIGS. 3–5 to meet specific bonding requirements in an automated fashion. Typically, an actual ceramic igniter will not be used but the material used in such igniters and the treatment process used to achieve a low resistivity shaft and a high resistivity tip can be employed in this invention. In other cases, the tip will be made of this ceramic material but the shaft can be made of other materials.

Thus, thermosonic bonding apparatus, 30, FIG. 3, bonding tool 40, FIGS. 3–5 and the method shown in FIGS. 6–8 achieve higher reliability bonds. The need for and the expense associated with an intensive gold cleaning processes is eliminated as is the need for convection heat sources. Thermal damage to electronic components is preventable because only a thermal pulse is used. Thermosonic bonding tool 40, FIGS. 3–5 also has a very long useful life.

By locally heating only tip 50 of bonding tool 40 with a short thermal impulse synchronized with the delivery of ultrasonic energy to the bonding tool, the need for ultra clean gold and conductive heat sources is eliminated without causing thermal damage to any electronic components and yet, at the same time, a better bond is made because both heat and ultrasonic energy are used.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A method of bonding a conductor to conductive bonding sites, the method comprising:
    a) bringing the conductor into contact with a first bonding site via a high resistivity tip of a bonding tool;
    b) applying a thermal pulse to the tip of the bonding tool;
    c) vibrating the tip of the bonding tool while the tip is heated to thermosonically bond the conductor to the first bonding site;
    d) terminating the thermal pulse and the vibrations;
    e) bringing the conductor into contact with a second bonding site via the tip of the bonding tool; and
    f) repeating steps b) and c).

2. The method claim 1 in which the tip of the tool is heated between 50° C. and 1,000° C.

3. The method of claim 1 in which the tip is vibrated at between 40 KHz–80 KHz.

4. A thermosonic bonding apparatus comprising:
    a bonding tool including a high resistivity ceramic tip which contacts a conductor to be bonded and a low resistivity shaft extending from the ceramic tip;
    an ultrasonic transducer for vibrating the high resistivity ceramic tip; and
    a source for locally heating the ceramic high resistivity bonding tool tip.

5. A thermosonic bonding apparatus comprising:
    an ultrasonic transducer;
    a bonding tool including:
        a high resistivity tip which contacts a conductor to be bonded, and
        a low resistivity shaft extending from the tip;
    a tool support arm interconnecting the bonding tool and the ultrasonic transducer to vibrate the high resistivity bonding tool tip; and
    a voltage source connected to the bonding tool to heat the high resistivity bonding tool tip.

6. The thermosonic bonding apparatus of claim 5 in which the bonding tool includes an insulative gap in the shaft to direct current to the high resistivity tip.

7. The thermosonic bonding apparatus of claim 6 in which the voltage source is connected to the bonding tool by a pair of conductors each contacting the shaft on opposite sides of the insulative gap.

8. The thermosonic bonding apparatus of claim 7 in which the conductors contact the shaft at a nodal location.

9. The thermosonic bonding apparatus of claim 5 in which the bonding tool is made of a ceramic alloy composition.

10. The thermosonic bonding apparatus of claim 5 in which the high resistivity tip is wedge shaped.

11. A thermosonic bonding tool apparatus comprising:
    a bonding tool including:
        a high resistivity tip which contacts a conductor to be bonded, and a low resistivity shaft extending from the tip;

means for imparting vibrations to the high resistivity tip; and means for locally heating the high resistivity tip.

12. The thermosonic bonding tool apparatus of claim 11 in which the means for imparting vibration includes an ultrasonic transducer and a tool support arm interconnecting the bonding tool and the ultrasonic transducer to vibrate the high resistivity bonding tool tip.

13. The thermosonic bonding tool apparatus of claim 11 in which the means for locally heating includes a voltage source connected to the bonding tool to provide pulses of voltage to the bonding tool.

14. The thermosonic bonding apparatus of claim 13 in which the bonding tool includes an insulative gap in the shaft to direct current to the high resistivity tip.

15. The thermosonic bonding apparatus of claim 14 in which the voltage source is connected to the bonding tool by a pair of conductors each contacting the shaft on opposite sides of the insulative gap.

16. The thermosonic bonding apparatus of claim 15 in which the conductors contact the shaft at a nodal location.

17. The thermosonic bonding apparatus of claim 11 in which the bonding tool is made of a ceramic alloy composition.

18. The thermosonic bonding apparatus of claim 11 in which the high resistivity tip is wedge shaped.

* * * * *